United States Patent [19]

Kondoh et al.

[11] Patent Number: 4,965,469
[45] Date of Patent: Oct. 23, 1990

[54] INPUT CIRCUIT OPERABLE UNDER DIFFERENT SOURCE VOLTAGES IN SEMICONDUCTOR INTEGRATED CIRCUIT

[75] Inventors: Harufusa Kondoh; Takeo Nakabayashi, both of Hyogo, Japan

[73] Assignee: Mitsubishi Denki Kabushiki Kaisha, Tokyo, Japan

[21] Appl. No.: 461,967

[22] Filed: Jan. 8, 1990

[30] Foreign Application Priority Data

Apr. 12, 1989 [JP] Japan .................................. 1-92564

[51] Int. Cl.$^5$ ................. H03K 19/003; H03K 19/088; H03K 17/14; H03K 17/687
[52] U.S. Cl. .................................... 307/446; 307/570; 307/544; 307/363; 307/475; 323/315
[58] Field of Search ............... 307/300, 310, 446, 570, 307/544, 475, 443, 542, 546, 551, 557, 561, 363, 355; 323/315

[56] References Cited

U.S. PATENT DOCUMENTS

| 4,438,352 | 3/1984 | Mardkha | 307/475 |
| 4,717,845 | 1/1988 | Dunn | 307/475 |
| 4,723,082 | 2/1988 | Asano et al. | 307/475 |
| 4,724,343 | 2/1988 | LeRoux et al. | 307/475 |
| 4,803,383 | 2/1989 | Hirochi | 307/544 |
| 4,874,969 | 10/1989 | Meadows | 307/355 |
| 4,896,056 | 1/1990 | Kunieda | 307/542 |

*Primary Examiner*—Stanley D. Miller
*Assistant Examiner*—Hanh Nguyen
*Attorney, Agent, or Firm*—Lowe, Price, Leblanc, Becker & Shur

[57] ABSTRACT

An input circuit provided in a MOS semiconductor IC having a compatible characteristics with an external TTL circuit. The input circuit comprises a circuit for generating a fixed reference voltage without depending on any supplied source voltage level, and a circuit for comparing the input voltage with the reference voltage. Therefore, a fixed margin for detecting the logic value of the input signal can be ensured regardless of whether the source voltage supplied is either 3.0 volts or 5.0 volts.

9 Claims, 4 Drawing Sheets

INPUT CIRCUIT OPERABLE UNDER DIFFERENT SOURCE VOLTAGES IN SEMICONDUCTOR INTEGRATED CIRCUIT

BACKGROUND OF THE INVENTION

1. Field of the Invention

The present invention relates generally to an input circuit for use in a semiconductor integrated circuit (IC) and, more particularly, to an improvement operable at different source voltages. The invention has particular applicability to a MOS IC retaining compatible characteristic with a transistor-transistor logic (TTL) circuit.

2. Description of the Background Art

Recently there have been increasing urgent demands for reducing power consumption in the operations of semiconductor ICs. One of the effective method for meeting such requirements is carried out by lowering a source voltage supplied to the semiconductor IC. In other words, desired reduction of the power consumption can be achieved by applying, instead of 5.0 volts used as a source voltage for the semiconductor IC generally in the present technical stage, a lower source voltage of, e.g. 3.0 volts to the semiconductor IC.

Meanwhile, for constituting requisite circuit configurations adapted for a variety of uses as in a computer system or the like, there are employed circuits formed in a great number of semiconductor chips. The terminals of such semiconductor chips are connected with one another by means of wiring to constitute individual circuits having desired functions. As exemplary ICs formed in such semiconductor chips, there are known a transistor-transistor logic (TTL) circuit and a metal oxide semiconductor (MOS) circuit. Generally a TTL circuit is composed of bipolar transistors, while a MOS circuit is composed of MOS transistors corresponding to one type of field effect transistors.

FIG. 5 is a circuit block diagram of a semiconductor chip (IC device) 100 constituted of an internal processing circuit 101 and MOS circuits 91 through 9n connected respectively to semiconductor chips 81 through 8n including TTL circuits. The semiconductor chip or IC device 100 is connected to receive the outputs of external TTL circuits 81 through 8n. Referring to FIG. 5, the semiconductor chip or IC device 100 comprises input circuits (or input buffer circuits) 91 through 9n connected to receive the respective output signals from the TTL circuits, and an internal processing circuit 101 to perform its function in response to the input signals. The signals thus processed by the circuit 101 are obtained via the output terminals.

FIG. 6 is a connection diagram of the conventional input circuit 91 shown in FIG. 5. Referring to FIG. 6, the input circuit 91 comprises a complementary inverter consisting of a PMOS transistor 23 and an NMOS transistor 24, and diodes 21 and 22 for protecting such inverter against damage by electrostatic charge.

In case the TTL circuit and the MOS circuit are connected to each other, the respective operating currents and voltages are mutually different, so that it becomes necessary to provide a circuit for adjusting the difference therebetween. For this reason, the input circuit 91 shown in FIG. 6 has the so-called TTL compatible characteristic for enabling connection of the TTL circuit 81 to the internal processing MOS circuit 101. Due to such TTL compatible characteristic, a high-level signal "H" is detected with certainty when an input signal of 2.0 volts or more is received; while a low-level signal "L" is detected with certainty when an input signal of 0.8 volt or less is received.

The inverter included in the input circuit 91 shown in FIG. 6 is so designed as to have such TTL compatible characteristic. Generally, the threshold value $V_{thin}$ of the complementary inverter shown in FIG. 6 is obtained from the following equation in relation to the threshold value $V_{tp}$ of the transistor 23 and the threshold value $V_{th}$ of the transistor 24:

$$V_{thin} = \frac{V_{cc} + V_{tp} + V_{th}\sqrt{Kn/Kp}}{1 + \sqrt{Kn/Kp}} \quad (1)$$

where Kp and Kn denotes the current amplification factors of the transistors 23 and 24 respectively.

FIG. 7A graphically shows the TTL compatible characteristic representing an exemplary case of applying a supply voltage of 5.0 volts. As mentioned above, logic "1" is detected in response to any input voltage above 2.0 volts, while logic "0" is detected in response to any input voltage below 0.8 volt.

As shown in FIG. 7A when the threshold value $V_{thin}$ of the inverter in FIG. 6 is set to 1.4 volt, margins MH1 and ML1 each of about 0.6 volt are obtained with respect to both logic "1" and "0". For enhancing the operational reliability of the logic circuit, it is essential to set mutually equal margins MH1 and ML1 in the inverter of the input circuit 91.

Setting the threshold value $V_{thin}$ of the inverter to 1.4 volt can be carried out by applying the conditions of Vcc=5.0 volts, $V_{th}$=1.0 volt and $V_{tp}$=−1.0 volt to Eq. (1) as:

$$\sqrt{Kn/Kp} = 6.5 \quad (2)$$

The amplification factor K of the transistor is calculated from the following equation in relation to its gate length L, gate width W, gate capacitance Cox and carrier mobility $\mu$:

$$K = \mu \cdot Cox \cdot W/L \quad (3)$$

Therefore, the value of Kn/Kp to satisfy the condition of Eq. (2) can be obtained by properly setting the respective ratios W/L of the transistors 23 and 23. As a result, there is achieved a complementary inverter having a threshold value $V_{th}$ of 1.4 volt at the source voltage Vcc of 5.0 volts as shown in FIG. 7A.

The complementary inverter incorporated in the input circuit 91 is designated on the assumption to operate at a predetermined source voltage Vcc (5.0 volts in the above example), hence raising the following disadvantage. That is, when a lower source voltage of 3.0 volts is supplied for the aforementioned purpose of reducing the power consumption, the threshold value $V_{thin}$ of the inverter becomes about 1.13 volt which is derived from applying the condition of Vcc=3.0 to Eq. (1).

FIG. 7B graphically shows the input characteristic of the complementary inverter indicated when a source voltage Vcc of 3.0 volts is supplied thereto. Since the threshold value of the inverter becomes about 1.13 volt as shown in FIG. 7B, the margin MH2 for logic "1" is increased when the margin ML2 for logic "0" is decreased. Consequently there arises another problem that the internal processing circuit functioning in response to the output signal of the inverter may fail to produce a proper processed result.

The problem caused by the change in the threshold value of the inverter will be understood well when FIG. 8 is referred. FIG. 8 shows the change of the input signal $V_{in}$ from the "L" level to the "H" level with time. Now, the input signal $V_{in}$ is assumed to have sharp pulses P1 to P6 having different maximum peak values as noises. The pulses P1 to P3 are superimposed on the input signal $V_{in}$ of the "L" level, while the pulses P4 to P6 are superimposed on the input signal $V_{in}$ of the "H" level. As shown in FIG. 8, when the threshold voltage $V_{thin}$ is 1.4 volt, the output level of the inverter is inverted only by the pulse P3 in the period T1. In the period T2, the output level of the inverter is inverted only by the pulse P6. Meanwhile, if the threshold value $V_{thin}$ is 1.13 volt, the output level of the inverter is inverted by the pulse P4 as well as the pulse P3 in the period T1. The foregoing shows that the possibility of detecting the "H" level as the input signal $V_{in}$ is increased by the decrease of the threshold voltage $V_{thin}$. In other words, the margin ML2 for the logic "0" is reduced, as described above.

SUMMARY OF THE INVENTION

One object of the present invention is to exactly detect the logic value of an input signal when a different source voltage is supplied to an input circuit provided in a semiconductor integrated circuit.

Another object of the invention is to ensure a margin for detecting the logic value of an input signal when a different source voltage is supplied to an input circuit provided in a semiconductor integrated circuit.

A further object of the invention is to obtain a characteristic compatible with a transistor-transistor logic (TTL) circuit when a different source voltage is supplied to an input circuit provided a semiconductor integrated circuit.

And still another object of the invention is to ensure, in an input circuit incorporated in a semiconductor integrated circuit, a satisfactory characteristic compatible with a transistor-transistor logic circuit regardless of whether the source voltage supplied is 3.0 volts or 5.0 volts.

Briefly stated, the input circuit of the present invention is provided in a semiconductor integrated circuit and is operable under different supply voltages. The input circuit is connected to receive an externally input signal having a logic value defined by a predetermined first or second voltage range. The input circuit comprises a reference voltage source generating a fixed reference voltage independent of the level of the supply voltage, a comparing circuit for comparing the voltage level of the reference voltage and an input signal. The reference voltage source comprises at least one bipolar transistor having an emitter-base junction, and a circuit connected to the supply voltage for turning on the bipolar transistor. A fixed voltage is generated as a reference voltage through the emitter-base junction.

In a preferred embodiment, the comparing circuit comprises a current mirror circuit receiving a first reference current for generating a second reference current which is a prescribed multiple of the first reference current, a first voltage current converting circuit responsive to the fixed reference voltage for generating the first reference current, a second voltage current converting circuit responsive to an input signal for generating a third reference current, and a circuit for coupling the second and third reference currents.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
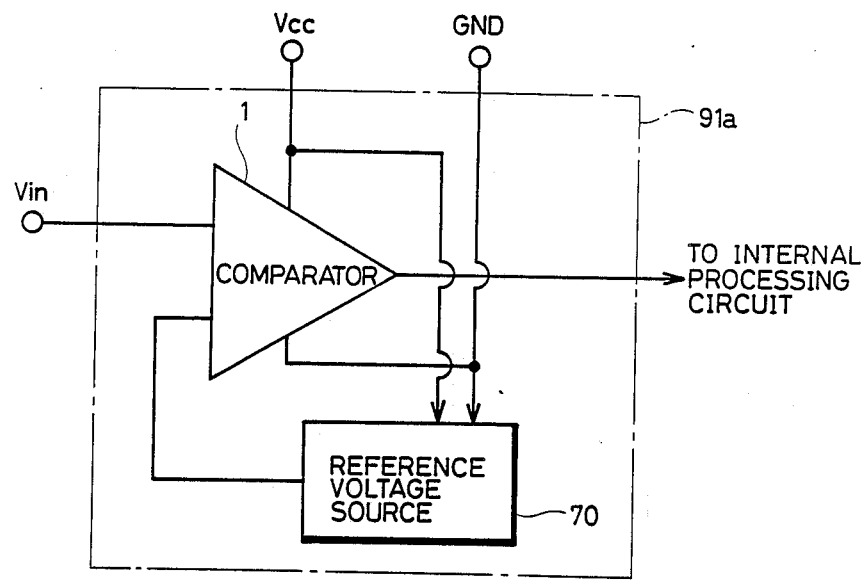
FIG. 1A is a block diagram showing the idea of the input circuit for the semiconductor integrated circuit in accordance with the present invention.
Figure 1B:
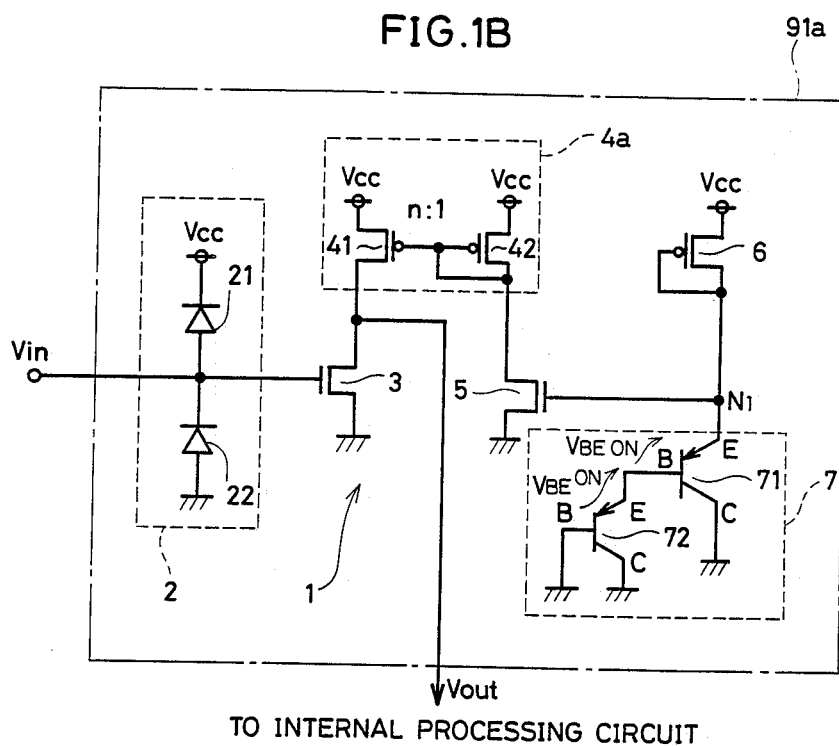
FIG. 1B is a connection diagram of an input circuit representing one embodiment of the present invention for use in a semiconductor IC.
Figure 5:
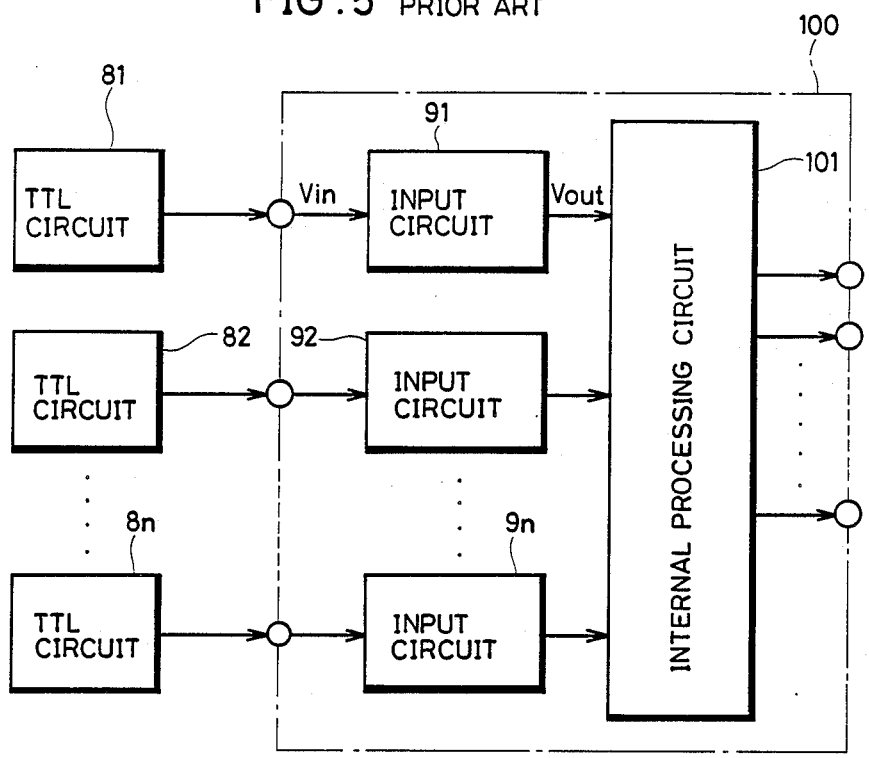
FIG. 5 is a circuit block diagram of a semiconductor chip including MOS circuits and connected to another semiconductor chip including TTL circuits.
Figure 6:
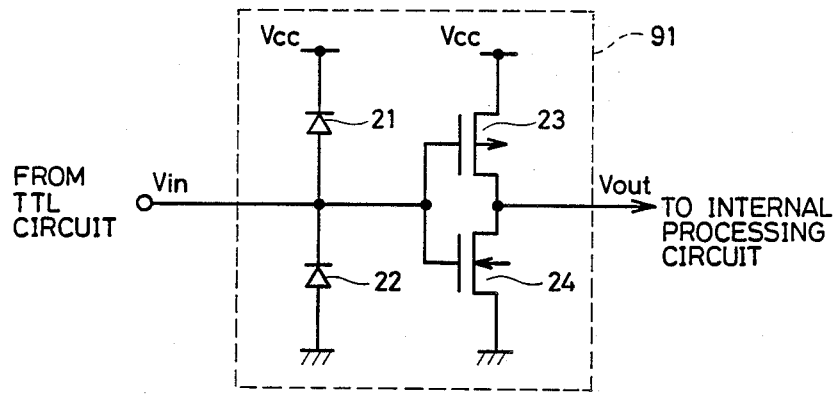
FIG. 6 is a connection diagram of the conventional input circuit shown in FIG. 5.

Referring to FIG. 1A, an outline of the input circuit for a semiconductor integrated circuit in accordance with the present invention will be described. The input circuit 91a comprises a reference voltage source 70 generating a prescribed reference voltage independent of the supply voltage level, and a comparator 1 for comparing the voltage level of the input signal $V_{in}$ with the reference voltage level. A supply terminal Vcc and a ground terminal GND are connected to the comparator 1 and to the reference voltage source 70. FIG. 1B shows a specific example of the input circuit 91a based on the circuit shown in FIG. 1A. The input circuit 91a is applied, for example, as one of input circuits 91 through 9n employed in a semiconductor chip 100 shown in FIG. 5. Referring to FIG. 1B, the input circuit 91a comprises an input protection circuit 2 connected to an input terminal, a comparator circuit 1 constituted of a current mirror circuit 4a and NMOS transistors 3 and 5, a PMOS transistor 6 serving as a load element or a resistor, and a circuit 7 for generating a reference voltage. The current mirror circuit 4a includes two PMOS transistors 41 and 42. The transistors 41 and 3 are connected in series to each other between a power source Vcc and the ground, and the node thereof is further connected to an internal processing circuit in the next stage. The transistor 3 is connected to receive an input signal $V_{in}$ via the input protector 2. The transistors 42 and 5 are connected in series to each other between the power source Vcc and the ground. The transistor 5 has the gate connected to the node of the transistor 6 and the reference voltage generator 7. The current ratio of the current mirror circuit 4a is set to n:1.

The reference voltage generator 7 consists of two pnp transistors 71 and 72. The transistor 72 has the collector and base connected to the ground. Meanwhile, its emitter is connected to the base of the transistor 71. The transistor 71 has the collector connected to the ground, and its emitter is connected to the power source Vcc via the load transistor 6. The transistors 71 and 72 are turned on by the source voltage Vcc supplied thereto. For example, when the transistor 72 is turned on, the voltage $V_{BEON}$ between its base and emitter amounts to about 0.7 volt. This phenomenon is known as "0.7 volt approximation" of a bipolar transistor. Also when the transistor 71 is turned on, a voltage of 0.7 volt is obtained between its base and emitter. Therefore, due to turn-on of the two pnp transistors 71 and 72, the node N1 is raised to a voltage of about 1.4 volt. Since the voltage at the node N1 is dependent on the base-emitter voltage of the pnp transistor as described above, it is substantially not affected by any change in the source voltage Vcc. Consequently, regardless of whether the source voltage Vcc of 5.0 volts or 3.0 volts is supplied, a voltage of about 1.4 volt can be applied to the gate of the transistor 5.

Now a description will be given with regard to the operation of the input circuit 91a shown in FIG. 1B. As the circuit 4a is formed of a current mirror circuit having a current ratio of n:1, there flows via the transistor 3 a greater current corresponding to n times the current determined by the voltage applied to the gate of the transistor 5. By setting the device size ratio (L/W) of the transistors 3 and 5 also to n:1, the current flowing via the transistor 3 equal to the current flowing via the transistor 5 when the respective gate voltages of the transistors 3 and 5 are mutually equalized. The input voltage $V_{in}$ is applied to the gate of the transistor 3 via the input protector 2. Therefore, when the voltage $V_{in}$ is higher even slightly than the gate voltage of the transistor 5, the current flowing via the transistor 3 is increased to be greater than the current flowing via the transistor 5, whereby the output voltage $V_{out}$ is reduced. To the contrary, when the input voltage $V_{in}$ is lower even slightly than the gate voltage of the transistor 5, the current flowing via the transistor 3 is rendered smaller than the current flowing via the transistor 5, whereby the output voltage $V_{out}$ is increased. Thus, the voltage comparator 1 is constituted of the current mirror circuit 4a and the transistors 3 and 5.

A current mirror circuit 4a is preferably used for forming the comparing circuit 1, in order to ensure sufficient capability of driving the interval processing circuit. More specifically, the transistor size of the transistor 41 is set to have sufficient value to drive the internal processing circuit. Meanwhile, the transistor size of the transistor 42 may be set to have a value no less than the minimum value required by the design rule. In other words, control of a large current for driving the internal processing circuit can be carried out by controlling the transistor 42 which has small transistor size.

Figure 7A:
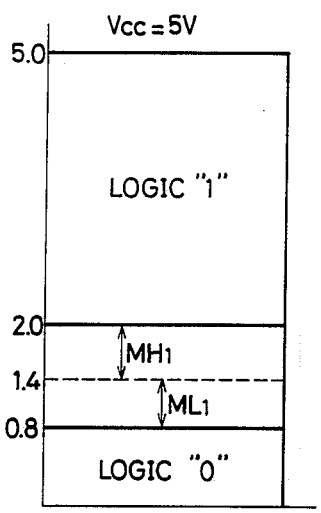
FIG. 7A graphically represents the characteristic compatible with a TTL circuit.
Figure 7B:
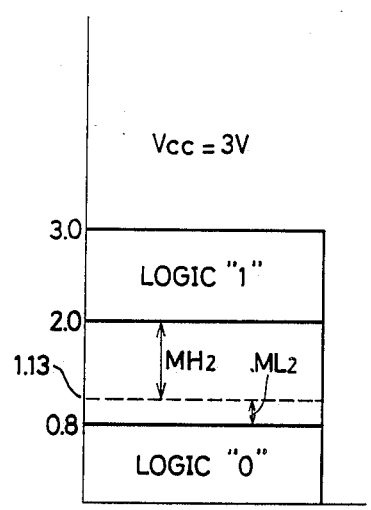
FIG. 7B graphically represents the input characteristic of the inverter of FIG. 6 obtained when a source voltage of 3.0 volts is supplied.
Figure 8:
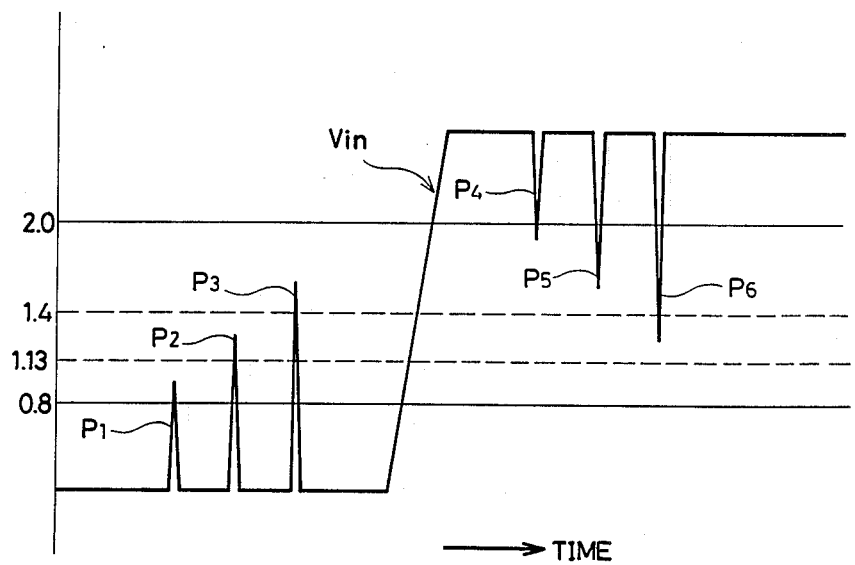
FIG. 8 is a waveform diagram illustrating the problem caused by the change in the threshold value of the inverter.

As mentioned above, the reference voltage generator 7 supplies a voltage of 1.4 volt to the gate of the transistor 5 without depending on the level of the source voltage Vcc. It signifies that the logic value designated by the input voltage $V_{in}$ can be detected by the voltage comparator despite any change in the source voltage Vcc. That is, the input circuit 91a shown in FIG. 1B has the input characteristic of FIG. 7A which is compatible with a TTL, circuit. Accordingly, regardless of whether the source voltage Vcc supplied is 5.0 volts or 3.0 volts, the margin MH1 for detection of logic "1" and the margin ML1 for detection of logic "0" are substantially equal to each other.

Now a description will be given with regard to the minimum voltage required for properly operating the input circuit 91a shown in FIG. 1B. Under the condition that each of the two transistors 41 and 42 has threshold value of $-1.0$ volt and the transistor 3 and 5 have a threshold value of 1.0 volt respectively, a voltage on the order of several hundred of milivolts is required, as an operational margin in addition to the threshold value, for achieving proper operations of the current mirror circuit 4a and the transistors 3 and 5. Therefore, a source voltage Vcc of about 2.5 volts is applicable. This signifies that the input circuit 91a shown in FIG. 1B is operable with complete accuracy at a source voltage Vcc of 3.0 volts.

Figure 2:
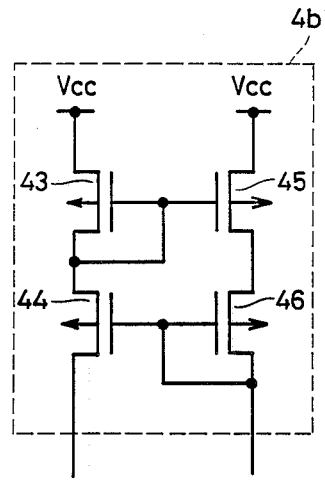
FIGS. 2 and 3 are connection diagrams of modified examples of the current mirror circuit shown in FIG. 1.
Figure 3:
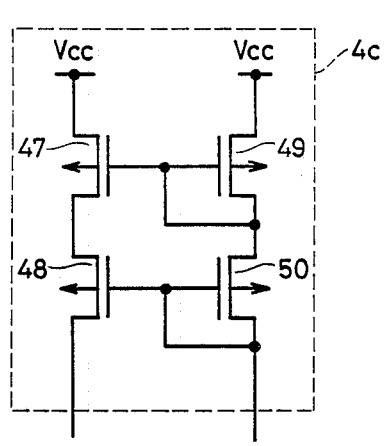

FIGS. 2 and 3 are connection diagrams of modified examples of the current mirror circuit shown in FIG. 1B. Thus, the current mirror circuit 4a of FIG. 1B can be replaced with a circuit 4b of FIG. 2 or a circuit 4c of FIG. 3. The application of these current mirrors 4b and 4c provide sharper DC characteristic. More specifically, the input circuit to which the circuits 4b and 4c are applied is capable of providing an output signal to the internal processing circuit in response to the input signal $V_{in}$.

Figure 4:
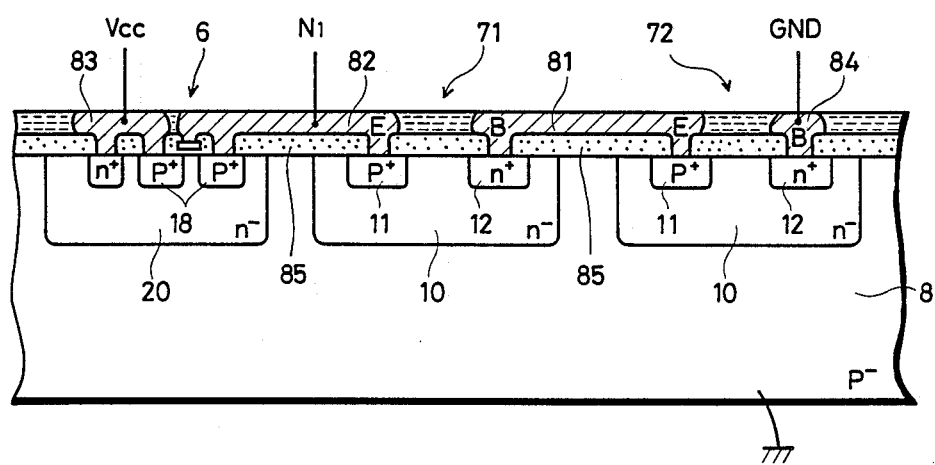
FIG. 4 is sectional view showing a partial structure of the input circuit of FIG. 1 formed on a semiconductor substrate.

Referring to FIG. 4, there is a cross sectional structure of npn transistors 71 and 72 and a PMOS transistor 6 formed on a semiconductor substrate 8 for constituting the reference voltage source shown in FIG. 1B. The npn transistors 71 and 72 are formed on $n^-$ regions 10 formed in a $p^-$ semiconductor substrate 8. The $p^+$ region 11 and $n^+$ region 12 formed in the $n^-$ region 10 constitute the emitter and the base, respectively. The transistor 71 has its base integrally connected to the emitter of the transistor 72 by means on an interconnection layer 81. The resistor, that is, the transistor 6 is formed on the $n^-$ region 20. $p^+$ regions 18 formed in the $n^-$ region 20 constitute the source and the drain of the transistor 6. The transistor 71 has its emitter integrally connected to the gate and the drain of the transistor 6 by an interconnection layer 82. The transistor has its source connected to the power supply Vcc through an interconnection layer 83. The transistor 72 has its base connected to the ground through an interconnection layer 84. An insulating layer 85 is formed for isolating respective layers on the substrate 8.

Although the input circuit 91a shown in FIG. 1B includes the reference voltage generator 7 consisting of two, pnp transistors 71 and 72, no particular step of processing of CMOS is required for providing such generator 7. As illustrated in FIG. 4, the bipolar transistor 72 can be formed on the same semiconductor substrate 1 where the other CMOS circuit is also existent, so that the reference voltage generator 7 can be provided with facility by the ordinary CMOS process. In other words, it is easy to form the input circuit of FIG. 1B together with the other CMOS circuit on the same semiconductor substrate.

Since the number of required component elements is small in the input circuit 91a of FIG. 1B, it is advantageous in view of attaining satisfactory integration thereof in a semiconductor IC. An operational amplifier and other known suitable circuits may be utilized as the comparator constituted of the current mirror circuit 4a and the transistors 3 and 5.

As mentioned above, the reference voltage generator 7 is provided in the input circuit 91a of FIG. 1B. Such a voltage generator 7 is formable with facility on the same semiconductor substrate where the other CMOS circuit is also existent as shown in FIG. 4. Thus, it becomes possible to attain with a facility a reference voltage source which is capable of generating a reference voltage of a fixed level regardless of whether the source voltage supplied is 5 volts or 3 volts. The comparator included in the input circuit 91 and constituted of the current mirror circuit 4a and the transistors 3, 5 functions to compare the input signal level with the reference voltage level. Accordingly, the input circuit is equipped with a satisfactory characteristic compatible with a TTL circuit regardless of whether the supplied reference voltage is 5 volts. Accordingly, due to the provisions of such comparator for comparing the input signal voltage with the reference voltage not dependent on the source voltage level, there can be accomplished, for use in a semiconductor IC, an improved input circuit which is capable of accurately detecting, despite supply of any different source voltage thereto, the input logic value prescribed on the basis of predetermined signal level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input circuit provided in a semiconductor integrated circuit and operable with any of different supply voltages, and input circuit being connected to receive an external input signal having a logic value prescribed by a predetermined first or second voltage range, said input circuit comprising:
   a reference voltage source for generating a fixed reference voltage that is independent of the level of said supply voltage, said reference voltage source comprising at least one bipolar transistor having an emitter-base junction, means connected to said supply voltage for turning on said bipolar transistor, a fixed voltage thereby being developed across said emitter-base junction, and means for providing said fixed voltage as said reference voltage; and
   comparator means for comparing the voltage levels of said input signal and said reference voltage.

2. An input circuit according to claim 1, wherein said comparator means including:
   a current mirror means receiving a first reference current and generating a second reference current that is a predetermined multiple of said first reference current,
   a first voltage to current converter means responsive to said fixed reference voltage for providing said first reference current,
   a second voltage to current converter means responsive to said input signal for generating a third reference current, and
   means for combining said second and third reference currents.

3. An input circuit according to claim 2, wherein said reference voltage source and said comparator means are formed on a single semiconductor substrate.

4. An input circuit according to claim 3, wherein the logic value defined by said first or second voltage range includes a logic value applicable to a transistor-transistor logic (TTL) circuit.

5. An input circuit according to claim 4, wherein said first voltage range is above 2.0 volts, and said second voltage range is below 0.8 volt.

6. An input circuit according to claim 1, wherein said different supply voltage include 3.0 volts and 5.0 volts.

7. An input circuit provided in a semiconductor integrated circuit and operable with any of different supply voltages, said input circuit being connected to receive an external input signal having a logic value prescribed by a predetermined first or second range, said input circuit comprising:
   a reference voltage source for generating a fixed reference voltage that is independent of the level of said supply voltage; and
   comparator means for comparing the voltage levels of said input signal and said reference voltage, said comparator means including a current mirror means receiving a first reference current and generating a second reference current that is a predetermined multiple of said first reference current, a first voltage to current converter means responsive to said fixed reference voltage for providing said first reference current, a second voltage to current converter means responsive to said input signal for generating a third reference current, and means for combining said second and third reference currents.

8. A reference voltage source formed on a single semiconductor substrate for generating a fixed reference voltage independent of a level of supply voltage, comprising:
   at least one bipolar transistor formed on said substrate having an emitter and a base, and
   resistance means formed on said substrate; wherein said bipolar transistor has its emitter connected to receive said supply voltage through said resistance means,
   the emitter of said bipolar transistor constituting an output node for outputting said reference voltage.

9. A reference voltage source according to claim 8, wherein
   said resistance means comprises a field effect transistor formed on said substrate having one electrode, the other electrode and a control electrode, said field effect transistor has one electrode connected to said supply voltage, the other electrode and the control electrode integrally connected to the emitter of said bipolar transistor.

* * * * *